(12) United States Patent
Qian (10) Patent No.: US 8,525,518 B1
(45) Date of Patent: Sep. 3, 2013

(54) IMPEDANCE MATCHING IN NMR PROBE WITH AN ADJUSTABLE SEGMENTED TRANSMISSION LINE

(75) Inventor: Chunqi Qian, Tallahassee, FL (US)

(73) Assignee: The Florida State University Research Foundation, Inc., Tallahassee, FL (US)

( * ) Notice: Subject to any disclaimer, the term of this patent is extended or adjusted under 35 U.S.C. 154(b) by 672 days.

(21) Appl. No.: 12/605,761

(22) Filed: Oct. 26, 2009

Related U.S. Application Data (60) Provisional application No. 61/111,068, filed on Nov. 4, 2008.

(51) Int. Cl.
*G01V 3/00* (2006.01)

(52) U.S. Cl.
USPC .......................................... 324/322; 324/318

(58) Field of Classification Search
USPC .................... 324/322, 318, 314; 333/17.3, 35
See application file for complete search history.

(56) References Cited

U.S. PATENT DOCUMENTS

| | | | | |
|---|---|---|---|---|
| 2,900,610 | A | * | 8/1959 | Allen et al. ...................... 333/35 |
| 4,827,219 | A | * | 5/1989 | Harrison ........................ 324/322 |
| 6,590,468 | B2 | * | 7/2003 | du Toit et al. ................ 333/17.3 |
| 7,936,233 | B2 | * | 5/2011 | Vellas et al. ................. 333/17.3 |

OTHER PUBLICATIONS

Stringer, et al., Methods for the Analysis and Design of a Solid State Nuclear Magnetic Resonance Probe, Review of Scientific Instruments, 1998, vol. 69, No. 9, pp. 3384-3391.

Martin, et al., Design of a Triple Resonance Magic Angle Sample Spinning Probe for High Field Solid State Nuclear Magnetic Resonance, 2003, vol. 74, No. 6, pp. 3045-3061.

Cusack, et al., Automatic Load Contour Mapping for Microwave Power Transistors, IEEE Transactions on Microwave Theory and Techniques, 1974, pp. 269-271.

Hamid, et al., On the Design of Stepped Transmission-Line Transformers, IEEE Transactions on Microwave Theory and Techniques, 1967, pp. 528-529.

\* cited by examiner

*Primary Examiner* — Louis Arana

(74) *Attorney, Agent, or Firm* — Jeremy Spier; David Jacobs; Smith & Hopen, P. A.

(57) ABSTRACT

Impedance matching between the RF probe and the spectrometer is a standard requirement for NMR probes. Both lumped element and branched transmission line methods are in wide use. Here we propose to use a segmented transmission line structure. It relies upon reflections between transmission lines of different impedances that are serially connected to match the impedance of a coil or resonator to the characteristic impedance of the NMR spectrometer. In an embodiment, two quarter-wave length dielectric slugs are placed within a coaxial transmission line. Adjustment of the positions of the slugs allows the variable tuning and matching needed for NMR probes, eliminating the need for variable capacitors and inductors.

2 Claims, 7 Drawing Sheets

Table 1: The predicted and measured lengths of transmission line segments $T_1$ and $T_3$ to match the load impedance. $T_2$ and $T_4$ are both quarter wave dielectric slugs (67.8 mm each). The load is a capacitively coupled LC resonator.

| | Freq | Load Impedance (Ω) | Reflection Coefficient | $T_1$ (mm) Predict | $T_1$ (mm) Actual | $T_3$ (mm) Predict | $T_3$ (mm) Actual |
|---|---|---|---|---|---|---|---|
| With sample | 499 | 94.8 + 100.8i | 0.535+0.324j | 214.7 | 216 | 33.6 | 33 |
| | 500 | 184.4 + 14.2i | 0.575+0.026j | 195.1 | 195 | 29.4 | 29 |
| | 501 | 102.9 - 79.8i | 0.486-0.268j | 170.3 | 170 | 27.7 | 27 |
| | 502 | 44.5 - 66.2i | 0.290-0.498j | 142.7 | 143 | 29.1 | 29 |
| Without sample | 499 | 31.1 + 78.4i | 0.362+0.616j | 231.5 | 232 | 43.4 | 43 |
| | 500 | 69.4 + 100.2i | 0.509+0.413j | 219.2 | 220 | 36.4 | 36 |
| | 501 | 163.7 + 72.3i | 0.580+0.142j | 202.6 | 202 | 31.1 | 31 |
| | 502 | 144.3 - 67.4i | 0.541-0.159j | 180.2 | 180 | 28.3 | 28 |

IMPEDANCE MATCHING IN NMR PROBE WITH AN ADJUSTABLE SEGMENTED TRANSMISSION LINE

CROSS REFERENCE TO RELATED APPLICATION

This application claims priority to U.S. Provisional Patent Application No. 61/111,068 by the same inventor, entitled "IMPEDANCE MATCHING IN NMR PROBE WITH AN ADJUSTABLE SEGMENTED TRANSMISSION LINE" filed Nov. 4, 2008.

GOVERNMENT SUPPORT

This invention was made with Government support under Grant No. DMR-0084173 awarded by the National Science Foundation. The Government has certain rights in the invention.

FIELD OF INVENTION

This invention relates to the field of Nuclear Magnetic Resonance (NMR) Imaging. Specifically, the invention relates to the use of a pair of dielectric slugs in transmission line as impedance transformers for a wide range of load impedance.

SUMMARY OF INVENTION

Impedance matching between the RF probe and the spectrometer is a standard requirement for NMR probes. Both lumped element and branched transmission line methods are in wide use. Here we propose to use a segmented transmission line structure. It relies upon reflections between transmission lines of different impedances that are serially connected to match the impedance of a coil or resonator to the characteristic impedance of the NMR spectrometer.

In an embodiment, two quarter-wave length dielectric slugs are placed within a coaxial transmission line. Adjustment of the positions of the slugs allows the variable tuning and matching needed for NMR probes, eliminating the need for variable capacitors and inductors.

BRIEF DESCRIPTION OF THE DRAWINGS

For a fuller understanding of the invention, reference should be made to the following detailed description, taken in connection with the accompanying drawings, in which.

DETAILED DESCRIPTION OF THE PREFERRED EMBODIMENT

In the following detailed description of the preferred embodiments, reference is made to the accompanying drawings, which form a part hereof, and within which are shown by way of illustration specific embodiments by which the invention may be practiced. It is to be understood that other embodiments may be utilized and structural changes may be made without departing from the scope of the invention.

Impedance matching is one of the most important concepts in magnetic resonance engineering. It ensures that power extracted from the precessing magnetization of the sample is efficiently transferred from the probe to the spectrometer to optimize the detection sensitivity. Impedance matching is also important to convert the transmit power produced by the RF amplifier into a strong rotating magnetic field $B_1$ within the sample coil. Many different circuits have been proposed for impedance matching to an RF sample coil in an NMR probe. The most widely known may be the L-network of two adjustable capacitors. A "tuning" capacitor in parallel with the coil cancels the inductive reactance of the coil, and a series "matching" capacitor steps down the impedance to match the characteristic impedance of the spectrometer, which is normally 50Ω. The two independent adjustments reflect the need to control both the real and imaginary parts of the impedance presented to the spectrometer, which is a common element in matching networks. The widespread availability of good nonmagnetic tuning capacitors is an important part of their popularity, but there is a tradeoff between capacitor size and breakdown voltage that works against their use at near microwave frequencies. Adjustable capacitors are often buffered by fixed capacitors or otherwise protected from the highest voltages in the probe circuit, but generally at a significant cost to tuning or matching range.

Transmission lines have often been employed in NMR probes as impedance transformers to allow single coils to be used for multiple nuclei at multiple frequencies. The transmission line elements are used to allow impedance matching and to improve isolation between the various channels in the probe. Here, the length of the transmission lines can be used to advantage as it allows the adjustable capacitors to be located remotely from the sample coil, which is often advantageous. While adjustable transmission lines have been used in some cases, most often commercial capacitors are the adjustable elements. The "Apex" and related designs are based on concentric coaxial capacitors that exhibit some transmission line behavior. Tuning and matching adjustments are carried out by inserting or withdrawing sleeves of dielectric material between the shield and inner conductor. These coaxial capacitors withstand high voltages and have been shown to have low loss. The mechanical implementation requires close tolerances and the electrical design requires computer simulation of the network because of transmission line effects and inductance in the adjustable capacitors.

Here, we propose a different method of adjustable impedance matching based on a coaxial transmission line within which two quarter-wave dielectric slugs can be independently positioned. The line can be thought of as a series of four connected transmission lines, two of which have a lower characteristic impedance due to the presence of the dielectric slugs. By changing the positions of dielectric slugs, the lengths of two of the transmission line segments can be changed and the voltage reflection at the input point can be minimized by the proper cancellation of internal reflections. Tuners based on this principle are used commercially for automatic testing of power amplifiers, where they are known as "double slug" or "interferometric" load-pull tuners, and the slugs are typically driven by computer-controlled motors. The basic structure is derived from the stepped transformer which has been long used in wireless communication. The adjustable segmented line requires no adjustable capacitors, and it has no other sliding contacts that might wear. Its long cylindrical shape fits nicely into the bore of an NMR magnet. But as we will show, this tuner has advantageous electrical properties as well. It is capable of matching a very wide range of loads, both inductive and capacitive, unlike the L-networks used in both lumped element and fixed-length transmission line probes. This interesting feature has allowed us to interchange the sample detector easily without modifications to the tuning circuit, so that the same probe body can be used with different sample coils.

Design Principle

Figure 1:
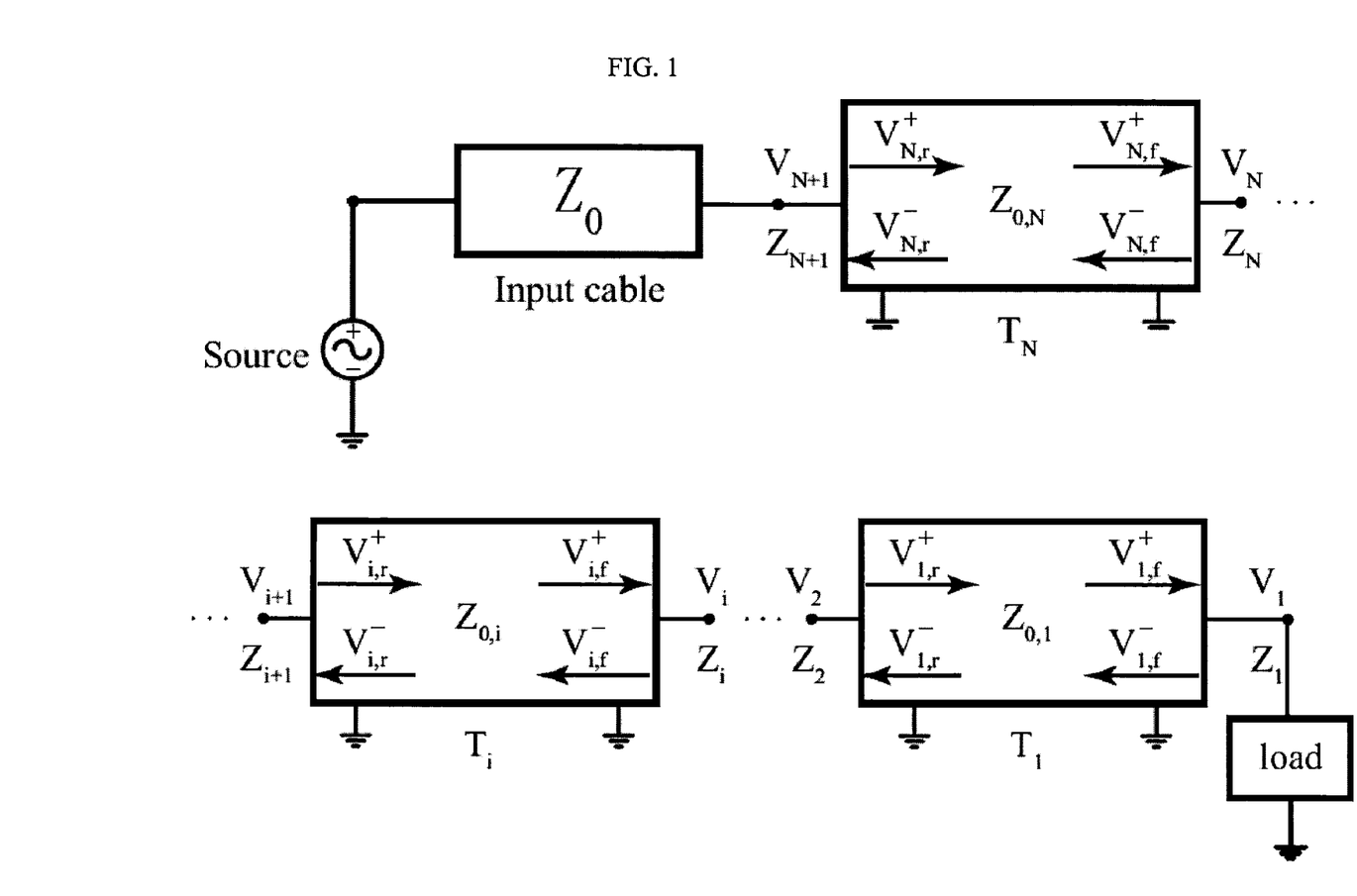
FIG. 1 is a block diagram of the multi-section transmission line.

In general, a segmented transmission line matching network might consist of any number N of transmission line segments connecting the load to the probe's input cable as shown in FIG. 1. Each segment $T_i$ consists of a transmission line of characteristic impedance $Z_{0,i}$ and complex propagation factor $\gamma_i = \alpha_i + j\beta_i$, where $\alpha_i$ is the attenuation constant and $\beta_i = 2\pi/\lambda_i$ is the phase constant where $\lambda_i$ is the wavelength. Segment $T_1$ is connected to a load of impedance $Z_1$, which consists of the rf sample coil or resonator. According to the well known formula for impedance transformation along transmission lines, the impedance $Z_2$ looking toward the load into segment $T_1$ is $$Z_2 = Z_{0,i} \frac{Z_1 + Z_{0,1}\tanh \gamma_1 l_1}{Z_{0,1} + Z_1\tanh \gamma_1 l_1} \quad (1)$$

And in general, the impedance $Z_{i+1}$ is related to $Z_i$ by the formula $$Z_{i+1} = Z_{0,i} \frac{Z_i + Z_{0,i}\tanh \gamma_i l_i}{Z_{0,i} + Z_i\tanh \gamma_i l_i} \quad (2)$$

Once N is chosen, we can use this chain relation for impedance to calculate a set of transmission line parameters $Z_{0,i}$, $l_i$ and $\gamma_i$ for i=1, . . . , N so that the $Z_{N+1}=Z_0$, the characteristic impedance of the input cable. Rather than proceed in this way, for reasons that will become clear later we prefer to work with reflection coefficients $\rho_i$ looking into the ith segment towards the load:

$$\rho_i = \frac{Z_i - Z_0}{Z_i + Z_0} \quad (3)$$

Note that these are not the actual reflection coefficients between the transmission line segments, but rather the reflection coefficients that would be obtained if each segment were connected to directly to the input cable. Combining equations (2) and (3) gives a chain relation linking the reflection coefficients at i th and the i+1th node:

$$\rho_{i+1} = -\frac{(Z_0^2(1+\rho_i) + Z_{0,i}^2(1-\rho_i))\tanh(\gamma_i l_i) - 2\rho_i Z_{0,i} Z_0}{(Z_0^2(1+\rho_i) + Z_{0,i}^2(1-\rho_i))\tanh(\gamma_i l_i) - 2\rho Z_{0,i} Z_0} \quad (4)$$

We can now look for solutions to the equation $\rho_{N+1}=0$, and these solutions will describe a segmented transmission line that tunes and matches the rf sample coil to the input cable.

Figure 2:
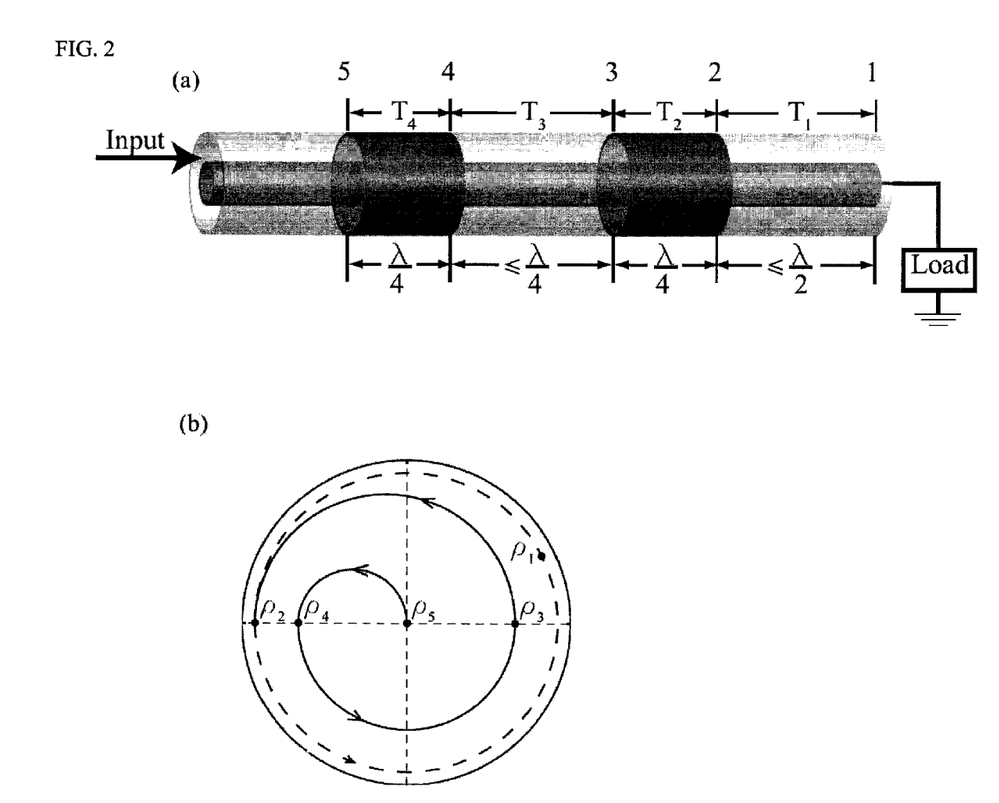
FIG. 2a is a schematic view of the four-segment transmission line.
FIG. 2b is the graphical representation of impedance transformation along the four-segment transmission line on the reflection coefficient chart (Smith chart)

Our design is shown in FIG. 2a. It consists of a coaxial tube into which two dielectric slugs of dielectric constant $\varepsilon_r$ have been inserted. The empty coaxial tube has a characteristic impedance of $Z_0$, equal to the impedance of the input cable, so that there are four electrically different segments $T_1$ through $T_4$. Segments $T_1$ and $T_3$ have the same characteristic impedance $Z_0$ as the input cable. Assuming that the same dielectric material is used in segments $T_2$ and $T_4$, their characteristic impedance will be reduced from that of the empty tubes by a factor of $\varepsilon_r$ as given by the standard formula for characteristic impedance of coaxial transmission lines:

$$Z_{0,2} = Z_{0,4} = \frac{59.95}{\varepsilon_r} \ln \frac{d_{out}}{d_{in}} \quad (5)$$

where $d_{out}$ and $d_{in}$ are the shield and inner conductor diameter, respectively. We can see from Eq. (5) that $Z_{0,2}=Z_{0,4}=Z_0/\sqrt{\varepsilon_r}$.

The problem of impedance matching is equivalent to obtaining a zero reflection coefficient $\rho_5$ between segment $T_4$ and the input cable. We solve this by using the chain relation Eq. (4) to express the relationships between the reflection coefficients. We begin by generating from Eq. (4) the transformations produced by $T_1$ and $T_3$:

$$\rho_2 = \rho_1 e^{-2j\beta l_1} \quad (6)$$

$$\rho_4 = \rho_3 e^{-2j\beta l_3} \quad (7)(6)$$

where $\beta = 2\pi/\lambda_{air}$ is the propagation constant of electromagnetic wave in the air, and we neglect transmission line loss so that $\gamma_1 = \gamma_3 \approx j\beta$. Note that these lengths $l_1$ and $l_3$ of $T_1$ and $T_3$ will adjustable. The second and the fourth transmission line sections are quarter wave dielectric slugs ($\gamma_2 l_2 \approx j\pi/2$ and $\gamma_4 l_4 \approx j\pi/1$) with characteristic impedance $Z_{0,2}=Z_{0,4}=Z_0/\sqrt{\varepsilon_r}$, so Eq. (4) yields:

$$\rho_3 = -\frac{(\rho_2 + 1) + (\rho_2 - 1)/\varepsilon_r}{(\rho_2 + 1) - (\rho_2 - 1)/\varepsilon_r} \quad (8)$$

$$\rho_5 = -\frac{(\rho_4 + 1) + (\rho_4 - 1)/\varepsilon_r}{(\rho_4 + 1) - (\rho_4 - 1)/\varepsilon_r} \quad (9)$$

Equations (6)-(9) form a complete description of our segmented transmission line matching network, and we can combine them to obtain the analytical solution for $l_1$ and $l_3$. Setting $\rho_5=0$ in Eq. (9) we derive for $\rho_4$:

$$\rho_4 = \frac{1 - \varepsilon_r}{1 + \varepsilon_r} \quad (10)$$

Combining Eq. (10) with Eq. (7) we obtain $\rho_3$:

$$\rho_3 = \left(\frac{1 - \varepsilon_r}{1 + \varepsilon_r}\right) e^{2j\beta l_3} \quad (11)$$

Combining Eq. (11) with Eq. (8) we obtain $\rho_2$:

$$\rho_2 = -\frac{(\varepsilon_r^2 - 1)(e^{j2l_3\beta} - 1)}{-(\varepsilon_r + 1)^2 + (\varepsilon_r - 1)^2 e^{j2l_3\beta}} \quad (12)$$

By inspection of Eq. (6), we can see that $\rho_1$ and $\rho_2$ will differ by a phase angle but will always have the same magnitude. Rather than substituting (12) into (6) to determine $l_3$ and $l_1$ simultaneously, we can simply require that $\rho_1$ and $\rho_2$ have the same magnitude. Substituting (12) into $\rho_2\rho_2^* = |\rho_1|^2$ results in the following equation for $l_3$:

$$\sin(l_3\beta) = \pm\frac{2|\rho_1|\varepsilon_r}{(\varepsilon_r^2 - 1)\sqrt{1 - |\rho_1|^2}} \quad (13)$$

We can see that values of $l_3$ that will match the probe will exist only if the right hand side of Eq. (13) is between –1 and 1, as discussed further below. If there are solutions for $l_3\beta$, we can see that the smallest will lie between 0 and $\pi/2$. Combining Eqns. (6), (12) and (13), and expanding the load reflection coefficient $\rho_l$ into $|\rho_l|e^{j\theta}$, we find that $l_1$ can be obtained from:

$$\cos(\theta - 2l_1\beta) = -\frac{(\varepsilon_r^2 + 1)|\rho_1|}{\varepsilon_r^2 - 1} \quad (14)$$

As for Eq. (14), a solution exists if the absolute value of right hand side is no larger than unity. To be compliant with the condition $0 < l_3\beta < \pi/2$, $\theta - 2l_1\beta$ needs to fall within the second quadrant of the Cartesian coordinate system.

In addition to determining the length of the required matching network for a given load reflection coefficient, two general conclusions can be drawn from Eqns. (13) and (14). First, the requirement that the right hand sides be less than unity means that the four element segmented transmission line is only capable of matching loads for which $$|\rho_1| \leq \frac{\varepsilon_r^2 - 1}{\varepsilon_r^2 + 1}. \quad (15)$$

Slugs with larger dielectric constants will be able to match a wider range of loads. Highly reflective loads for which $|\rho_1|$ is nearly unity will need to be partially matched with a fixed capacitor or inductor, but a segmented transmission line can be used effectively as the adjustable component. Second, we can determine the length L in free-space wavelengths $\lambda_{free}$ of an adjustable transmission line that can match all loads within the limit given by Eq. (15). We have seen that $l_1$ is never more than $\lambda_{free}/2$, and $l_3$ is never more than $\lambda_{free}/4$. The two dielectric slugs each have a length of $\lambda_{free}/4\sqrt{\varepsilon_r}$. So the total length of the adjustable line is $$L = \lambda_{free}\left(\frac{3}{4} + \frac{1}{2\sqrt{\varepsilon_r}}\right). \quad (16)$$

Adjustable slugs with a larger dielectric constant will lead to a shorter adjustable line, but never less than $3\lambda_{free}/4$. For NMR probes, it is clear that the adjustable transmission line will be most useful when $3\lambda_{free}/4$ is less than the overall length of the RF probe, so that the adjustable line fits completely into the probe.

It may be instructive to consider the impedance matching process of the segmented transmission line from the familiar perspective of a polar plot of the reflection coefficient. For purposes of this discussion, we will start from the matched impedance at the input port ($\rho_5 = 0$), and move along the segmented transmission line toward the load, ending up at $\rho_1$. This corresponds to a counterclockwise rotation along the transformation trajectory that starts at the center of FIG. 2b. We assume that $\rho_1$, the reflection coefficient of the NMR resonator, lies on the edge of the disk defined by Eq. (15). The goal is to move from the origin all the way out to $\rho_1$ at the limit of the matching range of the four segment transmission line. The first step is the low-impedance quarter wave segment $T_4$, which increases the magnitude of the reflection coefficient to a negative real value. The next segment, $T_3$, has the same characteristic impedance as the input cable, so it transforms only the phase of the reflection coefficient. In this case, the length of $T_3$ is one quarter wave, which, as indicated by Eq. (13), is required to match the largest values of $|\rho_1|$. The low-impedance quarter wave segment $T_2$ again increases the magnitude of the reflection coefficient. Subsequent transformation along the dashed circle to $\rho_1$ is carried out by segment $T_1$. The radius of the dashed circle, indicating the largest value of $|\rho_1|$ that can be matched by the four-segment transmission line, is given by Eq. (15).

As seen above, a segmented transmission line matching network uses a series of mismatched transmission lines to transform the impedance of an NMR resonator to the characteristic impedance of the spectrometer. These local mismatches lead to standing waves on the transmission line segments that contribute additional loss to the probe. While a full consideration of loss in segmented transmission line networks is beyond the scope of this paper, we did carry out a numerical evaluation to estimate the loss from standing waves in our prototype network. In this section we briefly illustrate how to set up the problem. For the loss calculation, it is more convenient to define the reflection coefficient with respect to $Z_{0,i}$, the complex characteristic impedance of the ith transmission line than the characteristic impedance of the input cable as in Eq. (3). To emphasize the difference, we designate it as $\rho_i'$.

$$\rho_i' = \frac{Z_i - Z_{0,i}}{Z_i + Z_{0,i}} \quad (17)$$

For the loss calculation, it important to use the complex form for the characteristic impedance:

$$Z_{0,i} = \sqrt{\frac{j\omega L_i + R_i}{j\omega C_i + G_i}} \quad (18)$$

where $L_i$, $C_i$, $R_i$ and $G_i$ are the distributed inductance, shunt capacitance, resistance and shunt conductance of the i th transmission line segment. We will also need to use the complex form of the phase constant, $\gamma_i = \alpha_i + j\beta_i$ where attenuation $\alpha_i$ is no longer zero.

Referring to FIG. 1, the total voltage at the (i+1)th node $V_{i+1}$ can be related to the incident voltage at the ith node $V_i^+$ by the following relation:

$$V_{i+1} \equiv V_{i+1,f}^+ + V_{i+1,f}^- \quad (19)$$
$$= V_{i,f}^+ \exp(\gamma_i l_i) + V_{i,f}^- \exp(-\gamma_i l_i)$$
$$= V_{i,f}^+ \exp(\gamma_i l_i) + \rho_i' V_{i,f}^+ \exp(-\gamma_i l_i)$$

And the total voltage at the (i+1)th node $V_{i+1}$ can also be expressed as:

$$V_{i+1} \equiv V_{i+1,f}^+ + V_{i+1,f}^- \quad (20)$$
$$= V_{i+1,f}^+ + \rho_{i+1}' V_{i+1,f}^+$$

Assuming that the incident voltage out of the input cable $V_s^+$ is known, $V_1$ can be obtained by repetitive use of the chain relation from Eq. (19) and Eq. (20). And the ratio of the power dissipated in the load versus the incident power from the input cable is the power efficiency (PE) of the segmented transmission line:

$$PE = \frac{\mathrm{Re}\left(\frac{|V_1|^2}{Z_1^*}\right)}{\mathrm{Re}\left(\frac{|V_s^+|^2}{Z_0^*}\right)} \quad (21)$$

Numerical evaluation of the power efficiency for a given load impedance using Eqn. (21) is straightforward as long as the propagation constants of the transmission line segments are known.

Exemplary Implementation

Figure 3:
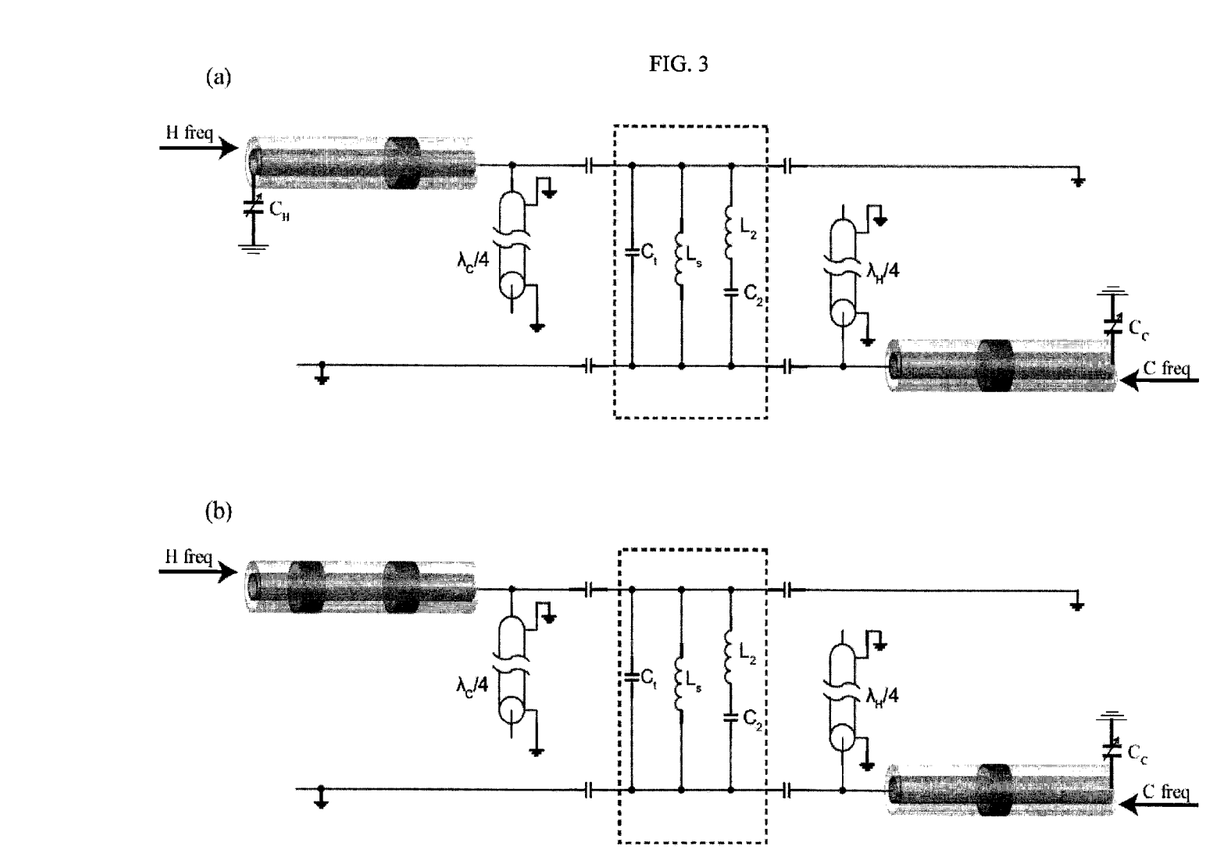
FIG. 3a depicts the circuit diagram of a double resonance NMR probe with conventional impedance matching method.
FIG. 3b shows the circuit diagram of the double resonance NMR probe with multi-segment transmission line matching in the high frequency channel. This impedance matching method uses a pair of dielectric slugs inserted into a uniform coaxial line with no parallel capacitor.

To demonstrate the design principle proposed in this paper, we incorporated the segmented transmission line into the Variable Angle Spinning probe that was home built in our lab for a 500 MHz widebore magnet. This probe has a double frequency resonator that is capacitively coupled to the main circuit by four coaxial capacitors. The coaxial capacitors are utilized to achieve contactless power transfer between the stationary tuning circuit and mobile sample coil so that a robust electric junction can be achieved for Variable Angle Spinning and Switched Angle Spinning experiments. Originally, both $^1$H and $^{13}$C channels were impedance matched by an L-network consisting of a transmission line with a single movable dielectric slug and a shunt variable capacitor as shown in FIG. 3a. This L-network, based on a tuning structure found in a Bruker Biospin probe, can be analyzed following an approach similar to the one outlined in the "Design Principle" section. The L-network for the $^1$H channel was later replaced with an adjustable segmented transmission line using a dual quarter-wave slug of the type described above as shown in FIG. 3b. The impedance of the probe was measured for a set of frequencies, and Eqns. (13) and (14) were used to predict the positions of the slugs required to match this impedance to 50 Ω.

The four-segment transmission line was constructed by inserting two dielectric cylinders into a coaxial line. Both the inner and outer tubes of the coaxial line were made of OFHC copper tubing. The outer tube has an OD of 0.625 inch and an ID of 0.571 inch, while the inner rod has a 0.25 inch outer diameter. This particular dimension was chosen so that the empty coaxial line would have a characteristic impedance of approximately 50Ω, equal to the system impedance of the spectrometer. The two dielectric slugs were fabricated from MACOR (Corning, Inc.), a ceramic material chosen because it is machinable. The slugs were fabricated to have an outer diameter of 0.564 in. and an inner diameter of 0.254 in., which gave them enough clearance within the copper tubes to move freely up and down. To allow quantitative comparison with Eqns. (13) and (14), the slugs should be exactly one quarter wave length at the operating frequency of 500 MHz. For MACOR, the relative dielectric constant $\epsilon_r \approx 5.7$. However, the gaps that allow free motion of the slugs reduce the effective dielectric constant of the relevant segments. We can take into account the effect of the two gaps on the capacitance per unit length of the cable by treating the gaps and the dielectric cylinder as three coaxial capacitors in series. Using the standard expression for the capacitance of the coaxial cylinders, the resulting effective dielectric constant $\epsilon_{eff}$ can be defined using the expresssion:

$$\ln\frac{R_a}{R_{in}} + \frac{1}{\epsilon_r}\ln\frac{R_b}{R_a} + \ln\frac{R_{out}}{R_b} = \frac{1}{\epsilon_{eff}}\ln\frac{R_{out}}{R_{in}} \quad (22)$$

where $R_{out}$ is the radius of the shield, $R_{in}$ the radius of the inner tube, $R_b$ and $R_a$ are the outer and inner radii of the dielectric slug, respectively. For the dimensions above, $\epsilon_{eff}=4.9$. The length of a quarter wave slug must then be 6.8 cm, about 8% longer than would have been obtained without the gaps. The slugs were cut to this length and inserted into the copper tubes.

Figure 5:
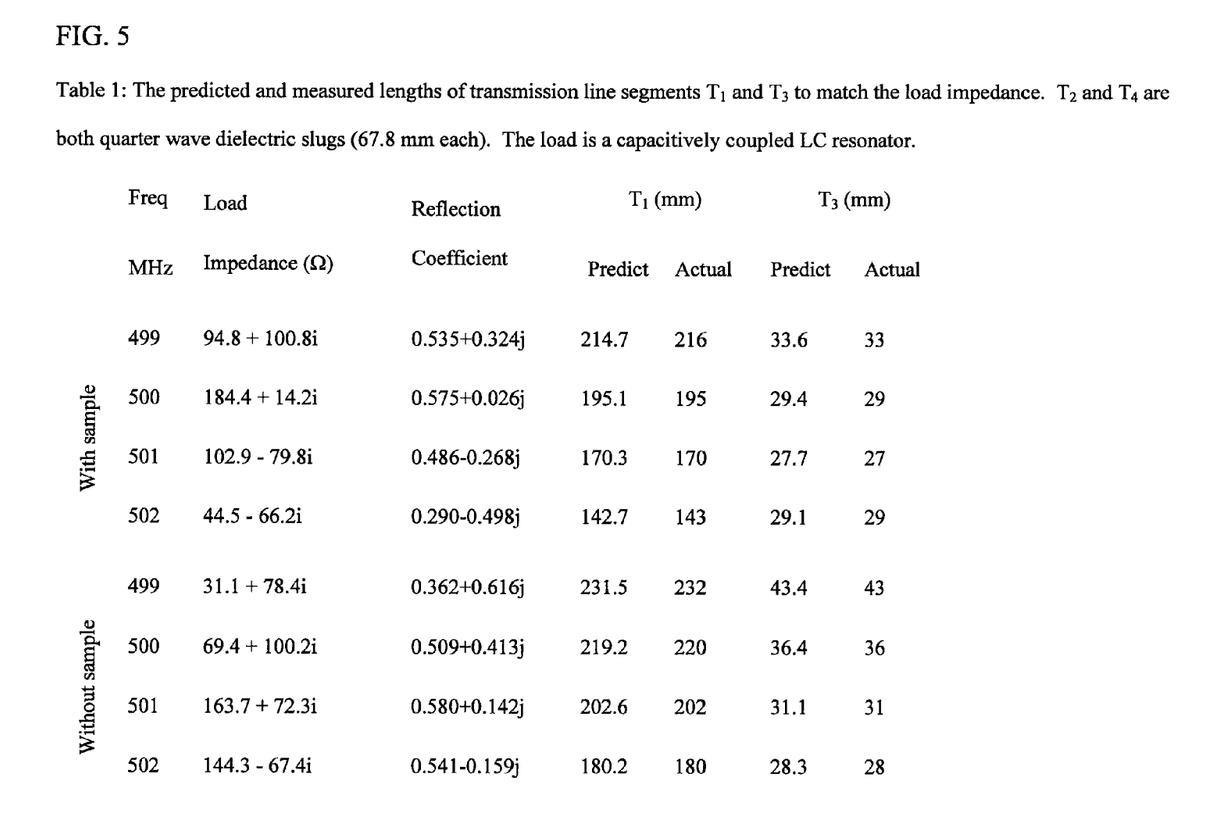
FIG. 5 is a table showing the predicted and measured lengths of transmission line segments $T_1$ and $T_3$ to match the load impedance of the double resonance probe.

To verify its operation, and to test the validity of Eqns. (13) and (14), the adjustable segmented transmission line was used to tune and match the probe at four frequencies both with and without a sample. The sample used for these tests was a 4 mm zirconia rotor filled with 20 μL, of 2% $H_2O/D_2O$. To accurately obtain the load impedance needed to calculate the required slug positions, the two dielectric slugs were removed from the coaxial line and a vector network analyzer was used to directly read out the unmatched impedance at the probe's input. The load impedance was calculated based on the known transmission line length using Eq. (1). Next, the dielectric slugs were inserted and their positions empirically adjusted to minimize the voltage reflection at the probe's input. Table 1, of FIG. 5, gives the measured lengths of transmission line segments required to match the probe under the above conditions and the predictions based on Eq. (13) and Eq. (14). Good agreement was found, tending to confirm the validity of our theoretical model. We should also note that the segmented transmission line was able to match the probe both with and without the aqueous sample.

We found that moving the two dielectric slugs together is similar to adjusting the tuning capacitor in a conventional network, and moving the bottom slug ($T_4$) with the top one fixed is similar to adjusting the matching capacitor. As is the case in a conventional network, the "tuning" and "matching" are not completely independent, and several iterations are required to minimize the reflected voltage.

We also compared the power efficiency of the two different matching circuits. The probe's input power was determined from the peak-to-peak voltage ($V_{p-p}$) displayed on a digital phosphor oscilloscope (1 GHz bandwidth) that was connected to the input cable via a 50 dB directional coupler. The power value was then be calculated by the following equation:

$$\text{Power} = \frac{10^5 V_{p-p}^2}{400} \tag{23}$$

where "$V_{p-p}$" is in units of volts and "Power" is in units of watts. When the proton channel was matched by the L-network shown in FIG. 3a, the 90° time was measured to be 4.65 µs with 22.9 watts of input power. In comparison, when the proton channel was matched by the segmented transmission line shown in FIG. 3b, it had 90° time of a 4.3 us with the same input power level. This corresponds to a 8% increase of $B_1$ field or a 17% increase of power efficiency. We believe the improved efficiency comes from the fact that the four-segment transmission line does not have loss from the branching capacitor or soldering junction present in the L-network.

Figure 4:
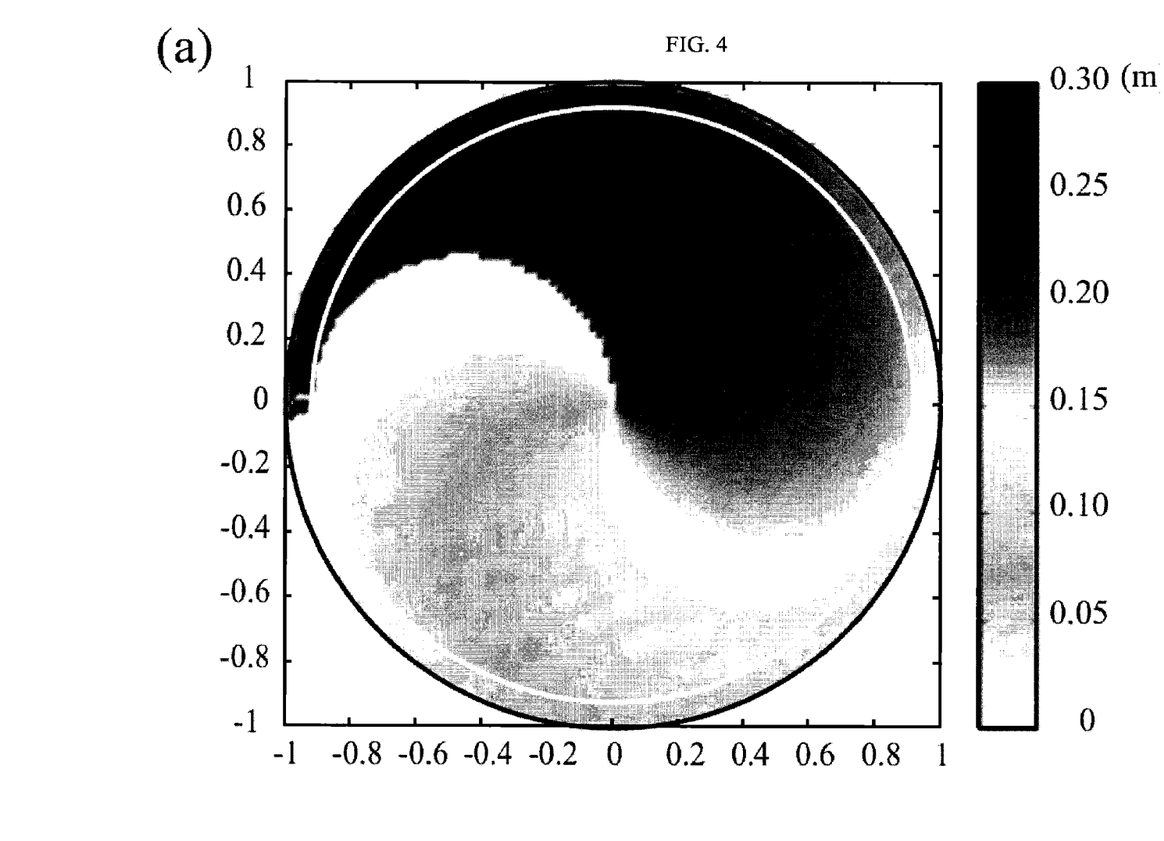
FIG. 4a is the simulated length of the first transmission line segment T1.
FIG. 4b is the simulated length of the third transmission line segment T3.
FIG. 4c is the simulated power efficiency.

To further explore the question of power efficiency, we performed a numerical simulation for the 500 MHz prototype segmented transmission line using the method proposed in the "Design Principle" section. A conductivity of 5.998×10⁷ S/m was assumed for the inner and outer copper tubes, and a value of 4.7×10⁻³ for the loss tangent of the MACOR dielectric slugs. FIGS. 4a and 4b show the calculated lengths of the transmission line segments $T_1$ and $T_3$ under different impedance loading conditions. For load impedance values within the circle defined by Eq. (15), the lengths of $T_1$ and $T_3$ were calculated using Eq. (14) and Eq. (13) respectively to give a perfect match to 50 Ω. Load impedance values outside this maximum reflection circle cannot be perfectly matched, so the length of $T_3$ was fixed to a quarter wave and the length of $T_1$ was numerically optimized to minimize the reflected power. The predicted power efficiency at 500 MHz is shown in FIG. 4c. Better than 90% power efficiency is achieved over almost the entire range defined by the maximum reflection circle. All of the measured load impedance values from Table 1, of FIG. 5, falls within the maximum reflection circle, and so they can all be expected to have good power efficiency.

While MACOR was chosen for the prototype because it is easily machinable using standard tools, it does have a loss tangent that is significantly greater than other ceramics that might be used for slugs. The loss calculation was repeated for slugs having the dielectric constant of MACOR but a loss tangent of 2×10⁻⁴, comparable to that of alumina. The calculated efficiency of the segmented transmission line improved from 90 to 98%, indicating that most of the loss in the line comes from the dielectric and not the resistivity of the copper conductors.

CONCLUSION

The adjustable segmented transmission line utilizes the multiple reflections between each segment to achieve overall impedance matching at the input port. Because there are no sliding contacts on the transmission line, this kind of tuning network should have excellent durability. By empirically adjusting the position of its two quarter wave slugs both inductive and capacitive loads can be matched. Because loads having reflection coefficients nearly equal to one cannot be completely matched with the network, it works best when employed along with partial matching. Such a configuration is embodied in a prototype 500 MHz VAS probe for which the adjustable transmission line is used to tune and match the ¹H channel.

We mainly dealt with the issue of the accessible range of load impedance. But in practice, a spectroscopist is more concerned with the frequency range over which a particular probe can be tuned. While the dielectric slugs are designed to match the greatest range of load impedance at a particular frequency, the adjustable line can be used over a reasonable range that should cover two nuclei as different in frequency as ¹H and ¹⁹F. A graphical analysis based on FIG. 2b indicates that slugs either shorter or longer than a quarter wave will result in a maximum reflection circle of smaller radius. For partially matched resonators, this is an acceptable limitation. We derived above that in order to match a load with a reflection coefficient of arbitrary phase, the lengths of the gaps $T_1$ and $T_3$ between the slugs should be adjustable up to a half and a quarter wavelength, respectively. For networks that will be used to match a range of frequencies, this requirement should be derived from the lowest frequency at which the probe will be used.

Although the present embodiment describes an application of the adjustable segmented transmission line for solid state NMR, it may have utility in other areas of magnetic resonance, particularly where a single tuning network is needed that can accommodate a great range of load impedance. An example of such an application may be probes for magnetic resonance imaging that are highly loaded, and so are subject to large shifts in load impedance by the range of possible samples or patients.

It will be seen that the advantages set forth above, and those made apparent from the foregoing description, are efficiently attained and since certain changes may be made in the above construction without departing from the scope of the invention, it is intended that all matters contained in the foregoing description or shown in the accompanying drawings shall be interpreted as illustrative and not in a limiting sense.

It is also to be understood that the following claims are intended to cover all of the generic and specific features of the invention herein described, and all statements of the scope of the invention which, as a matter of language, might be said to fall there between. Now that the invention has been described,

What is claimed is:

1. A segmented transmission line impedance matching network for NMR probes, comprising:

A segmented adjustable transmission line structure which relies upon reflections between transmission lines of different impedances that are serially connected to match the impedance of a coil or resonator to the characteristic impedance of an NMR spectrometer;

wherein at least two dielectric slugs are independently positioned within said segmented adjustable transmission line;

wherein adjustment of the positions of the at least two dielectric slugs allows the variable tuning and matching needed for NMR probes;

wherein 3λ free/4 is less than the overall length of an RF probe, where λ free is the length in free-space wavelengths;

wherein the total length of the RF probe for multiple dielectric segments is $$L = \lambda_{free}\left(\frac{3}{4} + \frac{1}{2\sqrt{\varepsilon_r}}\right)$$

where $\varepsilon_r$ is the dielectric constant of the at least two dielectric slugs.

2. A method of adjustable impedance matching, comprising the step of:

providing a device for adjustable impedance matching having a segmented adjustable transmission line structure which relies upon reflections between transmission line of different impedances that are serially connected to match the impedance of a coil or resonator to the characteristic impedance of an NMR spectrometer; wherein at least two dielectric slugs are independently positioned within said segmented adjustable transmission line, wherein adjustment of the positions of the at least two dielectric slugs allows the variable tuning and matching needed for NMR probes, wherein $3\lambda_{free}/4$ is less than the overall length of an RF probe, where $\lambda_{free}$ is the length in free-space wavelengths,
wherein the total length of the RF probe for multiple dielectric segments is $$L = \lambda_{free}\left(\frac{3}{4} + \frac{1}{2\sqrt{\varepsilon_r}}\right)$$

where $\varepsilon_r$ is the dielectric constant of the at least two dielectric slugs, adjusting the at least two dielectric slugs located on a coaxial transmission line; and
whereby changing the positions of the at least two dielectric slugs, the lengths of two of the transmission line segments can be changed and the voltage reflection at the input point can be minimized by the proper cancellation of internal reflections.

* * * * *